(12) United States Patent
Ausschnitt et al.

(10) Patent No.: US 6,879,400 B2
(45) Date of Patent: Apr. 12, 2005

(54) SINGLE TONE PROCESS WINDOW METROLOGY TARGET AND METHOD FOR LITHOGRAPHIC PROCESSING

(75) Inventors: Christopher P. Ausschnitt, Brookfield, CT (US); Timothy A. Brunner, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 637 days.

(21) Appl. No.: 09/734,062

(22) Filed: Dec. 11, 2000

(65) Prior Publication Data

US 2002/0097399 A1 Jul. 25, 2002

(51) Int. Cl.[7] ............................................. G01B 11/00
(52) U.S. Cl. ...................................................... 356/401
(58) Field of Search ................................ 356/399–401; 355/53, 55, 69, 70, 71; 250/548; 430/5, 20, 22, 30, 311

(56) References Cited

U.S. PATENT DOCUMENTS

| | | | |
|---|---|---|---|
| 5,476,736 A | * 12/1995 | Tanabe | ......................... 430/22 |
| 5,629,772 A | 5/1997 | Ausschnitt | |
| 5,712,707 A | 1/1998 | Ausschnitt et al. | |
| 5,731,877 A | 3/1998 | Ausschnitt | |
| 5,756,242 A | 5/1998 | Koizumi et al. | |
| 5,757,507 A | 5/1998 | Ausschnitt et al. | |
| 5,776,645 A | 7/1998 | Barr et al. | |
| 5,805,290 A | 9/1998 | Ausschnitt et al. | |
| 5,914,784 A | 6/1999 | Ausschnitt et al. | |
| 5,928,822 A | 7/1999 | Rhyu | |
| 5,949,547 A | 9/1999 | Tseng et al. | |
| 5,952,160 A | * 9/1999 | Bakeman et al. | ........... 430/394 |
| 5,953,128 A | 9/1999 | Ausschnitt et al. | |
| 5,965,309 A | 10/1999 | Ausschnitt et al. | |
| 5,968,693 A | 10/1999 | Adams | |
| 5,976,740 A | 11/1999 | Ausschnitt et al. | |
| 5,981,119 A | 11/1999 | Adams | |
| 5,985,495 A | 11/1999 | Okumura et al. | |
| 5,998,226 A | * 12/1999 | Chan | .......................... 438/10 |
| 6,004,706 A | 12/1999 | Ausschnitt et al. | |
| 6,027,842 A | 2/2000 | Ausschnitt et al. | |
| 6,128,089 A | 10/2000 | Ausschnitt et al. | |
| 6,130,750 A | 10/2000 | Ausschnitt et al. | |
| 6,137,578 A | 10/2000 | Ausschnitt | |
| 6,251,544 B1 | * 6/2001 | Inoue et al. | ................... 430/5 |
| 6,340,635 B1 | * 1/2002 | Toyota et al. | ............... 438/670 |

OTHER PUBLICATIONS

Intellectual Property Network, *Method for Measuring Semiconductor Lithographic Tool Focus and Exposure*, IBM Technical Disclosure Bulletin, Jul. 1987, pp. 516–518.

Alexander Starikov, *Exposure Monitor Structure* SPIE Integrated Circuit Metrology, Inspection, and Process Control IV, Vol 1261, 1990, pp. 315–324.

\* cited by examiner

*Primary Examiner*—Russell Adams
*Assistant Examiner*—Michelle P Nguyen
(74) *Attorney, Agent, or Firm*—DeLio & Peterson, LLC; Peter W. Peterson; Tiffany L. Townsend

(57) ABSTRACT

A metrology target mask includes a first array of spaced, substantially parallel elements having essentially the same length and width. Ends of the individual elements are aligned to form opposing array edges. The target mask also includes a second array of elements comprising a central element having a length and a width, and a plurality of spaced, substantially parallel outer elements having a length and a width. The width of the outer elements is less than the width of the central element, with edges of outer elements on each side of and farthest from the central element forming opposing array edges. The pitch of the outer elements is selected such that the outer elements are not resolvable after lithographic printing. After printing, the first array is sensitive to both dose and focus, and the second array is sensitive to dose but not focus, of the energy beam.

22 Claims, 7 Drawing Sheets

Ln = Nominal Length
Lp = Printed Length
Wn = Nominal Width
Wp = Printed Width

SINGLE TONE PROCESS WINDOW METROLOGY TARGET AND METHOD FOR LITHOGRAPHIC PROCESSING

BACKGROUND OF THE INVENTION

1. Field of the Invention

The present invention relates generally to manufacturing processes requiring lithography and, more particularly, to monitoring of lithographic and etch process conditions used in microelectronics manufacturing which is particularly useful for monitoring pattern features with dimensions on the order of less than 0.5 micron.

2. Description of Related Art

Control of a lithographic imaging process requires the optimization of exposure and focus conditions in lithographic processing of product substrates or wafers. Likewise, it is also important to optimize etching and other parameters on product wafers. Generally, because of the variations in exposure and focus, patterns developed by lithographic processes must be continually monitored or measured to determine if the dimensions of the patterns are within acceptable range. The importance of such monitoring increases considerably as the resolution limit, which is usually defined as minimum features size resolvable, of the lithographic process is approached. The patterns being developed in semiconductor technology are generally in the shape of lines both straight and with bends, having a length dimension equal to and multiple times the width dimension. The width dimension, which by definition is the smaller dimension, is of the order of 0.1 micron to greater than 1 micron in the current leading semiconductor technology. Because the width dimension is the minimum dimension of the patterns, it is the width dimension that challenges the resolution limits of the lithographic process. In this regard, because width is the minimum and most challenging dimension to develop, it is the width dimension that is conventionally monitored to assess performance of the lithographic process. The term "bias" is used to describe the change in a dimension of a feature from its nominal value. Usually the bias of interest is the change in the smallest of the dimensions of a given feature. Further, the term "bias" is invariably used in conjunction with a process such as resist imaging, etching, developing etc. and described by terms such as image bias, etch bias, print bias etc.

More recent lithographic monitoring improvements have been in optical metrology which rely on human or machine-read visual measurement of targets which employ arrays of elements having line widths and spacing below the wavelength of the light used to make the measurements. Improvements in monitoring bias in lithographic and etch processes used in microelectronics manufacturing have been disclosed in U.S. Pat. Nos. 5,712,707; 5,731,877; 5,757,507; 5,805,290; 5,953,128; 5,965,309; 5,976,740; 6,004,706; 6,027,842; 6,128,089 and 6,130,750, the disclosures of which are hereby incorporated by reference. The target and measurement methods of these patents rely on the increased sensitivity to process variation provided by image shortening. Some of these types of targets use image shortening effects to make the visual measurements of even though the individual array elements are not resolvable. Examples of such targets are disclosed in the aforementioned U.S. patents. Such targets permit visual monitoring of pattern features of arbitrary shape with dimensions on the order of less than 0.5 micron, and which is inexpensive to implement, fast in operation and simple to automate. These determine bias to enable in-line lithography/etch control using optical metrology, wherein SEM and/or AFM metrology is required only for calibration purposes.

The lithographic process window is the dose and focus space over which a set of features can be printed (i.e., exposed and etched) within allowable tolerances on a given mask level. Consequently, accurate and efficient means of measuring effective dose and focus simultaneously, referred to as process window metrology (PWM), are essential to lithography characterization and control. Prior art has established PWM methods that involve the use of dual-tone targets, such as those disclosed in U.S. Pat. No. 5,976,740. A drawback of these methods is that some product levels either do not allow the printing of dual-tone targets due to ground rule violations, or require exposure in a regime where the dual-tone targets do not provide adequate response. Starikov, in "Exposure Monitor Structure", *Integrated Circuit Metrology, Inspection and Process Control IV*, SPIE Vol. 1261, pp. 315–324, (1990), proposed an exposure monitor structure that is sensitive to dose, but not focus, using a fine structure that is not resolved by the optical lithography tool used for printing and which functions as a transmission wedge. Because the Starikov structure is only sensitive to dose, it is not able to determine the effects of focus.

In addition to the aforementioned problems in visual monitoring, the prior art also does not provide for electrically testable monitors to separate the effects of dose and focus.

Bearing in mind the problems and deficiencies of the prior art, it is therefore an object of the present invention to provide both a target mask and a target which may be used to evaluate and separate lithographic dose and focus variations.

It is another object of the invention to provide electrically testable structures to separate the effects of dose and focus in lithographic processing.

It is yet another object of the present invention to provide a method of separating the effects of dose and focus in lithographic processing in a target or monitor which can be formed on a single lithographic layer on a wafer substrate.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a metrology target mask for determining proper lithographic exposure dose and/or focus in a pattern formed in a layer on a semiconductor substrate by lithographic processing. The target mask comprises a mask substrate and a first, dose and focus sensitive mask portion on the mask substrate having a first array of elements comprising a plurality of spaced, substantially parallel elements having essentially the same length and width. Ends of the individual elements are aligned to form first and second opposing array edges, with the lengths of and spaces between the elements being sensitive to both dose and focus of an energy beam when lithographically printed in a layer on a semiconductor substrate. The target mask also includes a second, dose sensitive mask portion on the mask substrate having a second array of elements comprising a central element having a length and a width, and a plurality of spaced, substantially parallel outer elements having a length and a width. The width of the outer elements is less than the width of the central element, with edges of outer elements on each side of and farthest from the central element forming opposing array edges. The pitch of the outer elements is selected such that the outer elements are not resolvable after lithographic printing in a layer on a semiconductor substrate. The resulting printed second target portion width is sensitive to dose but not focus of the energy beam. Dose and/or focus of the energy beam during lithographic processing of the layer may be determined after projecting an energy beam through the mask and lithographically printing the mask portions in a layer on a semiconductor substrate and determining the widths of the first and second target portions in the layer by measuring distance between opposing array edges in each of the first and second portions.

The edges of the array in the first mask portion are preferably substantially parallel to edges of the array in the second mask portion, and the elements in the first mask portion are preferably substantially perpendicular to the elements in the second mask portion. The pitch between elements of the arrays in the second mask sensitive portion is less than the resolution limit of the energy beam in the imaging system used to expose the mask in the lithographic processing. The second, dose sensitive mask portion may include a plurality of outer elements on each side of the central element, with the width of the outer elements decreasing with distance from the central element. The elements of the first and second mask portions may comprise opaque elements on a substantially transparent mask substrate, or may comprise substantially transparent elements on an opaque mask substrate.

In another aspect, the present invention provides a metrology target mask for determining proper lithographic exposure dose and/or focus in a pattern formed in a layer on a semiconductor substrate by lithographic processing. The target mask comprises a mask substrate and a first, dose and focus sensitive mask portion on the mask substrate having a first array of elements comprising a plurality of spaced, substantially parallel elements having essentially the same length and width. Ends of the individual elements are aligned to form first and second opposing array edges, with the lengths of and spaces between the elements being sensitive to both dose and focus of an energy beam when lithographically printed in a layer on a semiconductor substrate. The target mask also includes a second, dose sensitive mask portion on the mask substrate having a second array of elements comprising a central element having a length and a width, and a plurality of spaced, substantially parallel outer elements having a length and a width. The outer elements are substantially perpendicular to the central element, with ends of the outer elements farthest from the central element being aligned to form first and second opposing array edges. The pitch of the outer elements is selected such that the outer elements are not resolvable after lithographic printing in a layer on a semiconductor substrate and the resulting printed second target portion width is sensitive to dose but not focus of the energy beam. Dose and/or focus of the energy beam during lithographic processing of the layer may be determined after projecting an energy beam through the mask and lithographically printing the mask portions in a layer on a semiconductor substrate and determining the widths of the first and second target portions in the layer by measuring distance between opposing array edges in each of the first and second portions.

The edges of the array in the first mask portion are preferably substantially parallel to edges of the array in the second mask portion, and the elements in the first mask portion are preferably substantially perpendicular to the outer elements in the second mask portion. The pitch between outer elements of the arrays in the second dose sensitive mask portion is less than the resolution limit of the energy beam in the imaging system used to expose the mask in the lithographic processing. The outer elements on the second, dose sensitive mask portion may be straight or tapered.

In a further aspect, the present invention provides a metrology target for determining proper lithographic exposure dose and/or focus in a pattern formed in a layer on a semiconductor substrate by lithographic processing. The metrology target comprises a substrate and a first, dose and focus sensitive target portion in a lithographically formed layer on the substrate having a first array of elements comprising a plurality of spaced, substantially parallel elements having essentially the same length and width. Ends of the individual elements are aligned to form first and second opposing array edges, with the lengths of and spaces between the elements being sensitive to both dose and focus of an energy beam when lithographically printed in a layer on a semiconductor substrate. The metrology target also includes a second, dose sensitive target portion in the lithographically formed layer on the substrate having a single element having a length and a width. Edges along the length of the single element form opposing array edges, and the width of the single element is sensitive to dose but not focus of the energy beam when lithographically printed in a layer on a semiconductor substrate. Dose and/or focus of the energy beam used during lithographic processing of the layer may be determined after determining the widths of few the first and second target portions in the layer by measuring distance between opposing array edges in each of the first and second portions.

The edges of the array in the first target portion are preferably substantially parallel to edges of the array in the second target portion, and the elements in the first target portion are preferably substantially perpendicular to the elements in the second target portion. The spacing between elements of the arrays in the first target portion is less than the resolution limit of the energy beam in the imaging system used to expose the mask in the lithographic processing.

In one embodiment, the substrate is electrically non-conductive, the elements in each of the first and second target portions are electrically conductive, and the elements in the first array are electrically connected. Upon applying a current across each of the arrays and measuring the voltage, the suitability of the layer may be determined by the resistance of each of the arrays. Preferably, each target portion has a first end and a second end, and the target portions are electrically connected at the second ends. There are included electrically conductive pads at the first end of each of the target portions and the connected second ends of the target portions, such that current may be applied between the pads on the target portion first ends and voltage may be measured between the first and second ends of each of the targets. The elements in the first target portion may be electrically connected by an electrically conductive central element, such that the individual elements of the first target portion extend in a perpendicular direction from each side of the first target portion central element.

In yet another aspect, the present invention provides a method of determining proper lithographic exposure dose and/or focus in a pattern formed in a layer on a semiconductor substrate by lithographic processing. The method comprises providing a semiconductor substrate and providing the metrology target mask of the type described above. The method further includes projecting an energy beam through the mask onto the semiconductor substrate, and lithographically forming a target in a layer on the semiconductor substrate having first and second target portions corresponding to the first and second mask portions, respectively. The method then includes determining the widths of the first and second target portions in the layer by measuring distance between opposing array edges in each of the first and second portions, and using the measured widths of the first and second target portions in the layer to determine dose and/or focus of the energy beam used during lithographic processing of the layer.

The elements of the second, dose sensitive mask portion may not be resolved by the energy beam in forming the corresponding second target portion, and the second target portion may comprise a single element formed in the layer on the semiconductor substrate having a length and a width, with edges along the length of the single element forming opposing array edges. Preferably, the edges of the array in the first target portion are substantially parallel to edges of the array in the second target portion, and the elements in the first target portion are substantially perpendicular to the element in the second target portion.

Another aspect of the present invention provides a method of electrically testing image shortening of a pattern formed on a substrate by lithographic or etch processing. The method comprises providing the electrically conductive target as described above, applying a current across the first and second target portions, measuring the voltage drop and determining the resistance across each of the first and second target portions, and determining the suitability of the layer by the resistance of the first and second target portions. By this method there may be determined the suitability of energy beam dose or focus on a lithographically formed layer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
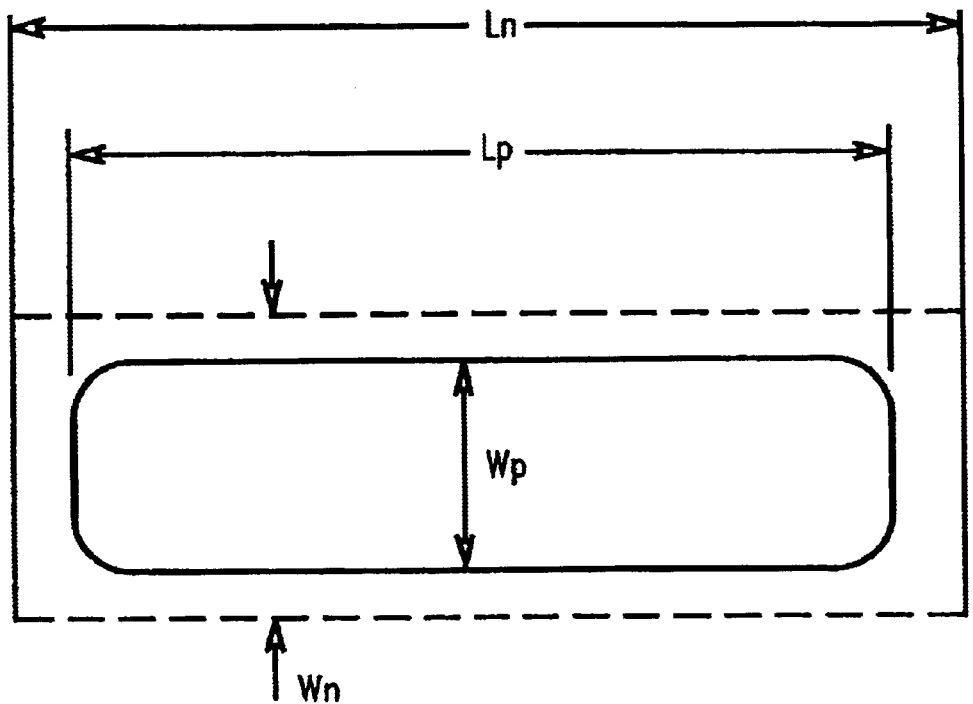
FIG. 1 is a top plan view of an element illustrating image shortening effect.

In describing the preferred embodiment of the present invention, reference will be made herein to FIGS. 1–8 of the drawings in which like numerals refer to like features of the invention. Features of the invention are not necessarily shown to scale in the drawings.

The concept of image shortening in photolithographic targets is disclosed in U.S. Pat. Nos. 5,712,707 and 5,976,740, the disclosures of which are hereby incorporated by reference. The concept of image shortening is incorporated in the present invention which provides both an image shortening visual test pattern or target, for low resolution metrology targets, and an electrically testable image shortening monitor, for high resolution metrology targets. As disclosed in U.S. Pat. No. 5,976,740 the simultaneous tracking of line and space length enables the unique solution of relative dose and focus measurements. By measuring the resistance of structures affected by this image shortening phenomena, it is possible to calibrate where the lithographic process is in the dose-focus space electrically. In addition, it is possible to discern the offsets in ideal dose and focus within the same field, wafer or lot.

Referring to FIG. 1, for a line or space, whose nominal length $(L_n)$ is greater than its nominal width $(W_n)$, the pattern imaged by a lithography tool in photoresist will have printed dimensions $L_p$, $W_p$. Image shortening or foreshortening describes the case where the printer bias of the length $(L_n - L_p)$ exceeds the print bias of the width $(W_n - W_p)$. The image shortening effect becomes pronounced as the resolution limit of the lithography tool/process is approached.

Factors that contribute to image shortening include the following:

(1) The corners that must form the ends of the line or space contribute higher spatial frequency components relative to the middle of the line or space. Consequently, a given imaging system cannot resolve the ends as well as the middle, and a portion of the shortening is present in the aerial image.

(2) The photoactive compound (PAC) is the key chemical component for image formation in all photoresists. Diffusion of the PAC occurs within the photoresist film during expose and post-expose-bake processes. This diffusion will enhance the shortening as the width of the line or space approaches the diffusion length.

(3) The mask itself can contribute to shortening due to the resolution/process limitations inherent in mask patterning, these effects will be most severe for 1×masks, but can also be significant on 5× or 10×masks in the form of corner rounding and/or foreshortening on the mask. Corner rounding on the mask will enhance the shortening present in the aerial image of the lithography tool.

(4) Resist stress relief at develop could also lead to shortening effects.

Measurements have been made of the increased sensitivity of the length dimension to exposures and focus variation relative to the width dimension. For example, the experimental data shows the effect of exposure dosage on the width and length dimension of a line for different focus conditions. From the data, comparing the dependence of the length dimension on exposure to that of the width, where the nominal line width is 250 nm and the nominal line length is 2 um, it can be concluded that the sensitivity of the width bias to exposure (slope) is approximately 17 nm/mj/cm², and the sensitivity of the length bias to exposure (slope) is approximately 29 nm/mj/cm². Thus the length shows approximately 1.7× greater sensitivity to exposure variation than does the width. For a given process, the magnitude of this sensitivity factor is dependent on factors that affect image shortening as described above.

Further, comparisons of the dependence of the length on focus to that of the width have also shown that the length shows significantly greater deviation from nominal with defocus. The data shows that length bias is at least equal or more sensitive to exposure than width bias and shows a trend with the minimum feature size. Length bias is also predictable from length bias measurement, and the length sensitivity relative to the width increases as the nominal width decreases.

Figure 2:
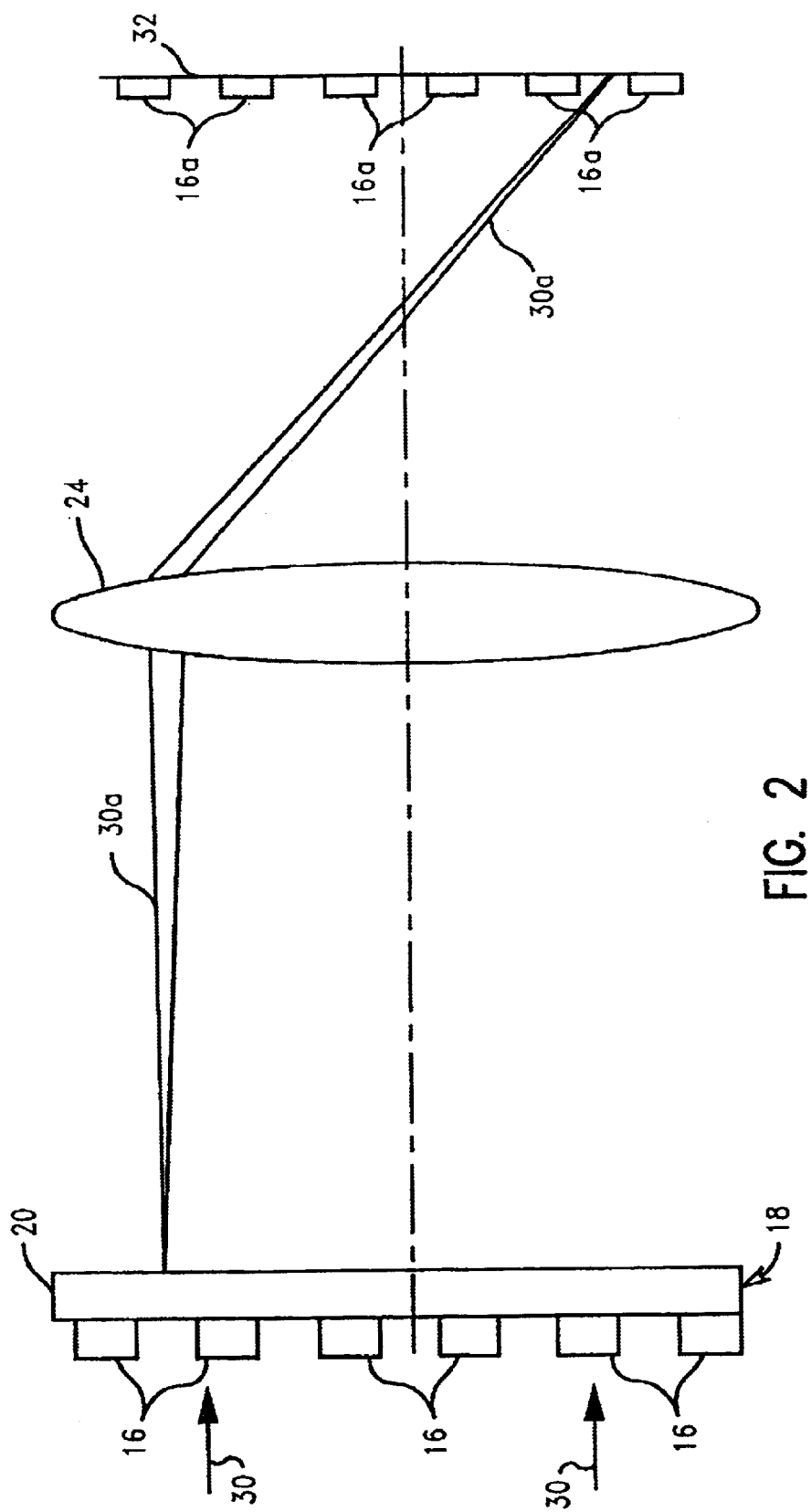
FIG. 2 is a schematic of a side view of a lithographic mask used to create a target image during lithography.

An example of a lithography process using a mask made in accordance with the present invention is shown in FIG. 2. Radiation comprising energy beam 30 passes through a portion of mask 18 comprising a substrate layer 20 sufficiently transparent to the radiation on which are deposited opaque segments conforming to the target image to be projected. Opaque segments 16 comprise the parallel array of elements and form a portion of the total target portion of the lithography mask. The beam 30 portion that passes through the mask 18 between opaque segments 16 is illustrated by beam 30a. Beam 30a is focused by lens system 24 onto the surface 32 of a semiconductor wafer having conventional resist materials sensitive to the radiation. Radiation blocked by mask portions 16 does not transfer to the resist layer on surface 32. Thus, a contrasting latent image of the parallel array elements 16a is formed on wafer resist surface 32 which conforms to the pattern of the opaque layer on the mask. The resist is then developed, and the resist pattern created by the latent image is used to etch a desired target or portion thereof on the wafer. The target of the present invention is employed to determine the quality of the lithographic formation of functional circuits elsewhere on the wafer.

Figure 3:
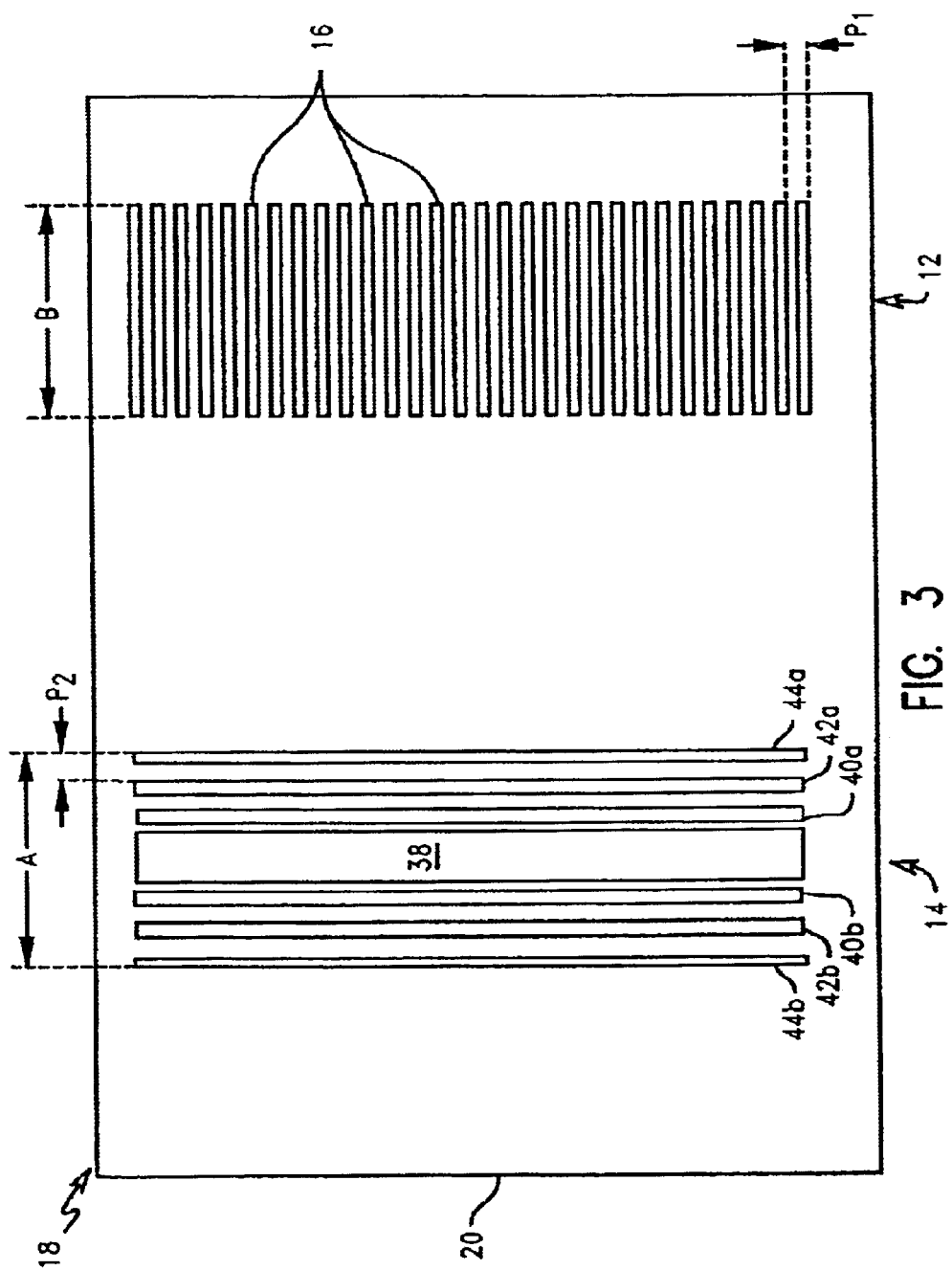
FIG. 3 is a top plan view of a mask used to make the single-tone process window metrology target and method of the present invention, useful for low resolution metrology targets.

FIG. 3 depicts one embodiment of a mask pattern 18 of the present invention which includes on mask or reticle substrate 20a first portion 12 sensitive to both dose and focus, and a second portion 14 sensitive to dose only. The mask elements described below may be made by forming the elements as opaque segments on a transparent substrate, or by forming transparent segments on an opaque substrate, depending on the desired lithographic processing. The dose and focus sensitive mask portion is made up of an array of a plurality of spaced, substantially parallel elements 16, each element having a length greater than its width. Each element 16 has essentially the same length in the horizontal direction and width in the vertical direction. The element 16 length is indicated as B. The ends of the elements 16 are aligned to form first and second opposing and parallel array edges, and the width of the array is also B. The width (vertical dimension) of the element, and the space between elements, comprises the pitch $P_1$ of the array. The pitch P1 is preferably uniform throughout the array 12. The lengths of and spaces between the elements being sensitive to both dose and focus of an energy beam when lithographically printed in a layer on a semiconductor substrate.

The second, primarily dose sensitive mask portion 14 comprises an array of elements which includes a central element having a length in the vertical direction and a width in the horizontal direction, On each side of central element 38 are a plurality of spaced, substantially parallel outer elements 40a, 40b, 42a, 42b, 44a, 44b, also having a length in the vertical direction and a width in the horizontal direction. The width of each of the outer elements is less than the width of the central element, and decreases with increasing distance of each outer element from the central element. As shown, on the right side of central element 38, the width of element 42a is less than the width of element 40a, and the width of element 44a is less than the width of element 42a. Likewise, on the left of the central element, the width of element 42b is less than the width of element 40b, and the width of element 44b is less than the width of element 42b. Other outer elements may be added as desired, however, the dose sensitive target is useful with even a single outer element spaced from and adjacent to a central element. The edges of outer elements 44a, 44b on each side of and farthest from central element 38 form opposing array edges. The sum of the width of each outer element and the spacing which separates the outer element from another element is the outer element pitch $P_2$. To ensure that the outer elements are not resolved, $P_2$ is kept constant with increasing distance of each outer element from the central element. Alternatively, the width of the elements 40a, 40b, 42a, 42b, 44a, 44b could be kept constant while $P_2$ decreases; however, this would be a more difficult pattern to fabricate.

When determining the size and pitch of the elements in the dose and focus sensitive mask portion 12 and the dose sensitive mask portion 14, pitch $P_1$ of the dose and focus sensitive mask portion 12 is selected so that the individual elements are resolvable after lithographic printing, i.e., exposure, developing and etching, in a layer on a semiconductor substrate. On the other hand, pitch $P_2$ of dose sensitive mask portion 14 is selected so that the outer elements are not resolvable after lithographic printing. As a result, width of the printed second target portion 14 is sensitive to dose but not focus of the energy beam used to expose the lithographic resist layer.

Pitch $P_1$ of the dose and focus sensitive mask portion 12 is selected by the following equation:

$$P_1 \geq \frac{\lambda}{NA(1+\sigma)}$$

and pitch $P_2$ of dose sensitive mask portion 14 is selected by the following equation:

$$P_2 < \frac{\lambda}{NA(1+\sigma)}$$

where:
  P is the element pitch;
  $\lambda$ is the energy beam wavelength being used by the lithographic tool;
  NA is the numerical aperture of the lithographic tool; and
  $\sigma$ is the partial coherence (or ratio of illumination NA to objective NA).

For example, if NA=0.7, σ=0.6 and the energy beam wavelength is 248 nanometers, $P_1$ should be greater than or equal to 221 nanometers, and $P_2$ should be less than 221 nanometers. Experiments have shown that a single unresolved element 40 is sufficient to enhance the dose sensitivity and decrease the focus sensitivity to differentiate the A and B responses to dose and focus. In the case where multiple elements are employed, as shown in FIG. 3, the widths of each element step down in size. To achieve a linear roll off in transmission, the widths should decrease quadratically. In practice, however, a linear decrease is also effective, as Starikov has shown.

Figure 4:
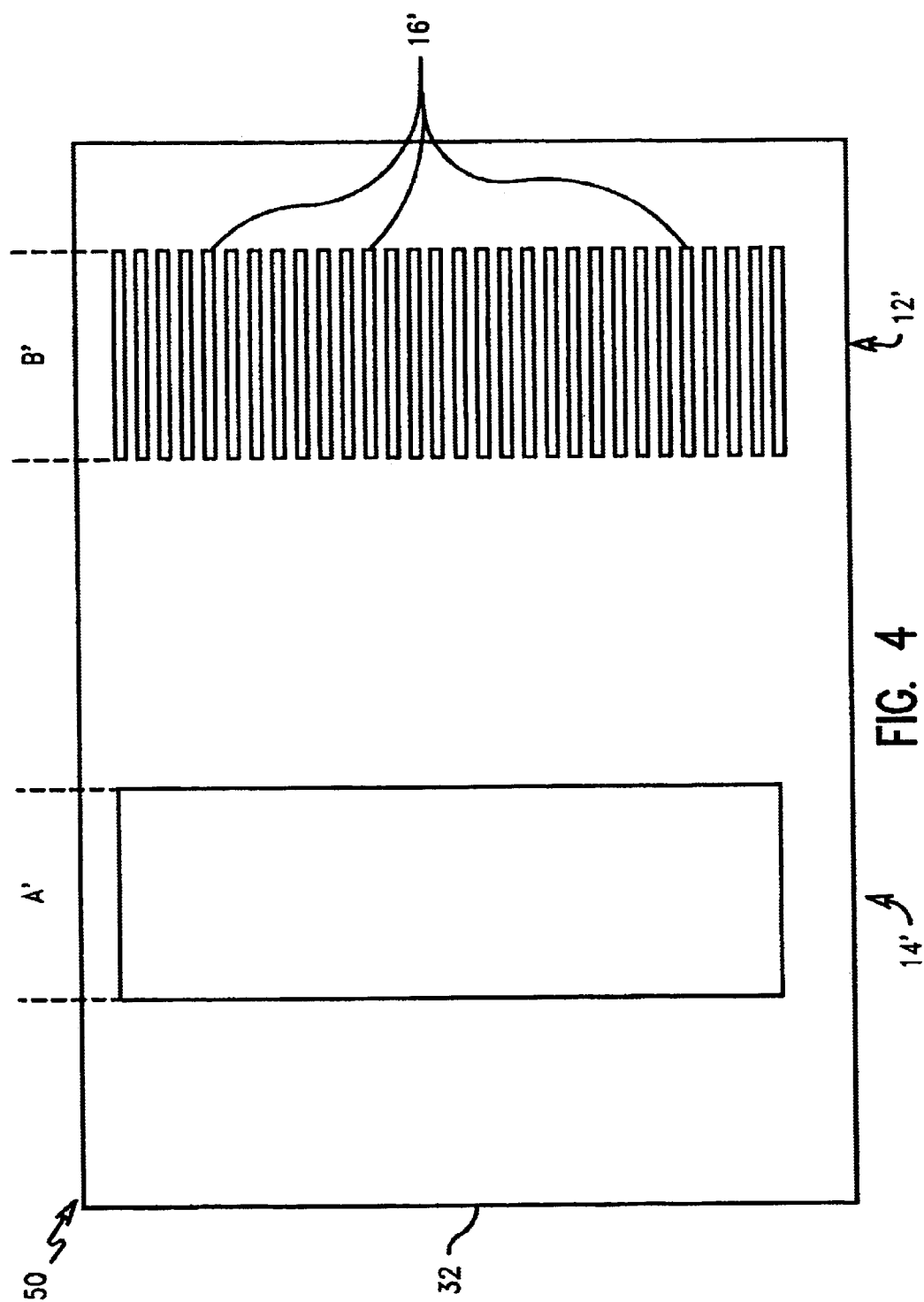
FIG. 4 is a top plan view of the target created using the mask of FIG. 3.

A resulting target after lithographic exposure and developing is shown in FIG. 4, where the individual printed elements 16' of dose and focus sensitive target portion 12', (corresponding to dose and focus sensitive mask portion 12) are still resolvable, while the individual elements of dose sensitive target portion 14' (corresponding to dose sensitive mask portion 14) are not. In the dose and focus sensitive target portion 12', the width B' is determined by both dose and focus of the energy beam during lithographic processing. In the dose sensitive target portion 14', the length (vertical dimension) corresponds to the original length of the dose sensitive mask portion 14, while the width A' is sensitive to dose of the energy beam during lithographic processing. The combination of the two target portions makes it possible to compare the two target portion widths, A' and B', and to separate out the dose from the focus effects of the energy beam during lithographic processing, and to do so in a target 50 created on a single resist layer 32 on the semiconductor wafer.

Focus and dose parameters may be determined as a mathematical function of the measured dimensions of the latent or developed image shape, A', and space, B'. To do so, the measured (A', B') response to exposure, E, and defocus, F, settings must be pre-characterized by measurements through a focus exposure matrix (FEM). The defocus is defined as the magnitude of the deviation of the focus from its optimum; namely $F=|z-z_0|$. The focus setting, z, is the deviation in microns from the tool focus baseline and $z_0$ is the optimum lithographic focus position. In general, a parametric model describes the A' and B' response to focus and dose:

$$A',B'=a_0^{A',B'}+a_1^{A',B'}E+(a_2^{A',B'}+a_3^{A',B'}E)F^2 \quad (1)$$

The coefficients $a_0 \ldots {}_3$ and the optimum focus $z_0$ are determined by a least-squares fit to the measured data. The exposure setting, E, is expressed as a fractional deviation of the exposure input to the stepper, $E_{FEM}$, from the optimum exposure, $E_0$, that prints chip features at their desired size at $z=z_0$; namely, $E=(E_{FEM}-E_0)/E_0$. Consequently, the optimum lithographic operating point is defined by $E=0$ and $F=0$.

Given the coefficients, $a_0 \ldots {}_3$, derived from the FEM, the simultaneous Equations (1) can be solved for (E, F), where F is the deviation from best focus, or "defocus", defined by: $F^2=(z-z_0)^2$.

$$E = \frac{-\beta \pm \sqrt{\beta^2 - 4\alpha\chi}}{2\alpha} \quad (2)$$

$$F^2 = \frac{A',B' - (a_0^{A',B'} + a_1^{A',B'}E)}{a_2^{A',B'} + a_3^{A',B'}E} \quad (3)$$

Where:

$\alpha = a_1^{B'}a_3^{A'} - a_3^{B'}a_1^{A'}$ $\beta = a_3^{B'}A' - a_3^{A'}B' + a_0^{B'}a_3^{A'} + a_1^{B'}a_2^{A'} - a_2^{B'}a_1^{A'} - a_3^{B'}a_0^{A'}$ $\chi = a_2^{B'}A' - a_2^{A'}B' + a_0^{B'}a_2^{A'} - a_2^{B'}a_0^{A'}$.

For the assumed model, only one of the solutions for E in Equation (2) is physically meaningful (falls within the dose range of the FEM). The quadratic dependence of focus implies two solutions for z symmetric about $z_0$. Thus, at a single location, we are only able to solve for the magnitude of the defocus, F, by Equation (3), where substituting either A' or B', and the associated coefficients, gives the same answer.

In the case of the target design shown in FIG. 3, where A' is dependent only on dose, the following condition holds:

$a_2^{A'}=a_3^{A'}=0$

Consequently, dose and defocus are more easily separable as:

$$E = \frac{A' - a_0^{A'}}{a_1^{A'}} \quad (4)$$

$$F^2 = \frac{B' - (a_0^{B'} + a_1^{B'}E)}{a_2^{B'} + a_3^{B'}E} \quad (5)$$

The target of FIG. 4 is especially useful as a metrology target that can be measured at relatively low resolution. In other words, dimensions A' and B' can be greater than 1 μm, measurable by an optical metrology tool, and still not violate the ground rules for a particular chip level. However, the target of FIG. 4 may also be used for high resolution metrology targets, where the measurable dimensions A' and B' are less than 1 μm and can be comparable to the minimum chip dimension.

Figure 5:
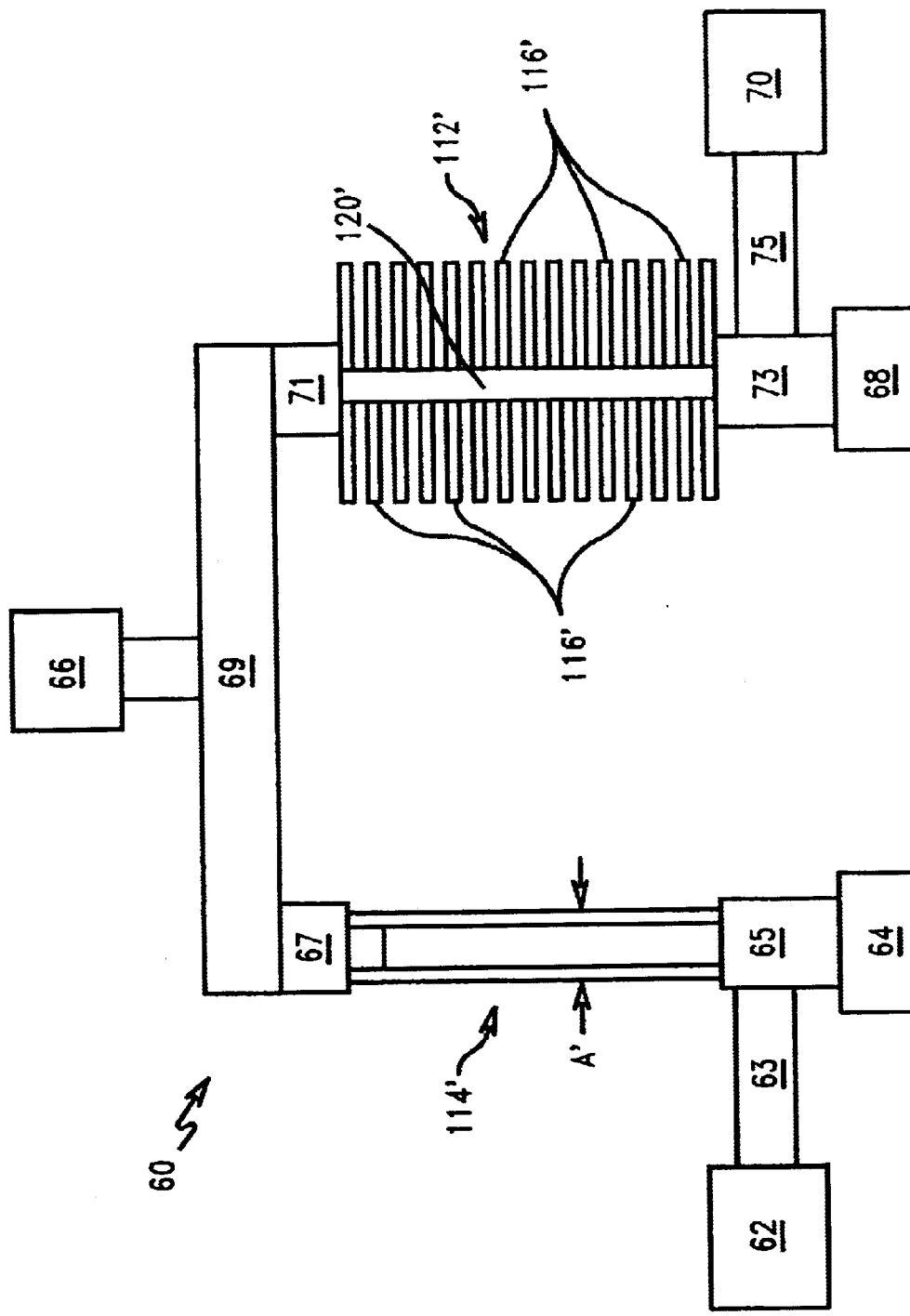
FIG. 5 is a top plan view of a second embodiment of the single-tone process window metrology target and method of the present invention, employing an electrically testable monitor or target useful for high resolution metrology targets.

A more preferred high resolution target is shown in FIG. 5, in the form of an electrically testable target or monitor 60. The monitor is made up of electrically conductive segments formed by depositing an electrically conductive material having a controlled resistivity and patterning it by lithography and etch. Examples are alloys or metals such as aluminum or copper, or doped polysilicon. Electrically conductive elements or areas 62, 64, 66, 68 and 70 form pads which may be contacted by probes to drive a current across selected portions of monitor 60, so that the voltage may be read between the selected pads in order to determine the resistance of the selected portions of the monitor. Electrically conductive connector segments are also lithographically formed and electrically connect the pads to other portions of the monitor.

Dose and focus sensitive monitor portion 112' comprises a plurality of spaced parallel electrically conductive array line elements 116', each having a length greater than the width, and analogous to target elements 16' shown in FIG. 4. Elements 116' extend outward in a perpendicular direction on opposite sides from, and are electrically connected to, a straight, rectangular central conductive element 120' which is disposed between the ends of the individual array elements, in a direction essentially perpendicular to the direction of the individual array elements 116'. The right and left edges of central conductive element 250 are preferably straight and essentially parallel. The dose and focus sensitive monitor portion 112' is lithographically exposed from a mask having corresponding elements thereon, and the pitch of the mask elements 116 is chosen so that the monitor elements 116' are resolvable after exposure and developing on the resist layer, and subsequent etching and deposition of the electrically conductive material.

Figure 6:
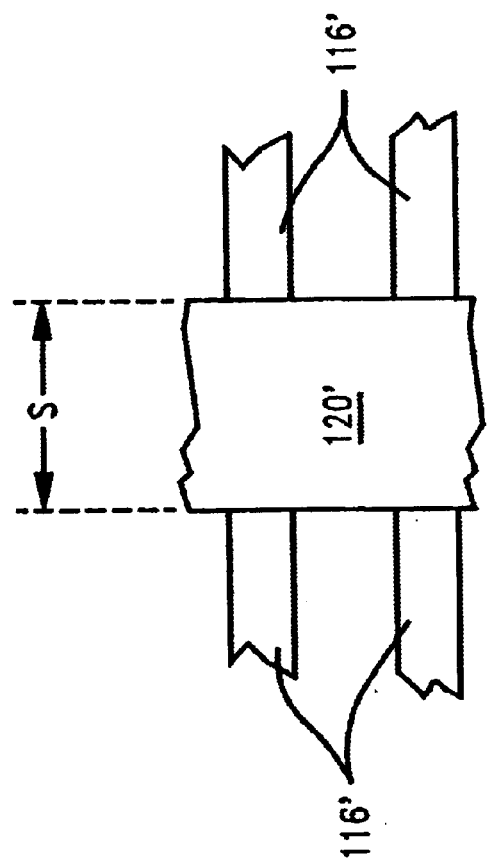
FIG. 6 is a top plan view of a portion of the mask used to make the dose and focus sensitive portion of the monitor of FIG. 5.

In a manner analogous to the image shortening effect of the individual array elements, changes in exposure dose and focus during lithographic processing causes shortening of the ends of the spaces between the individual array elements at the area of intersection with central element 120'. The shortening effect of these spaces results in differences in the width s (horizontally as shown in FIG. 6) of central element 120' as measured at its left and right edges. Changes in the actual width of element 120' will result in a change in resistance of the element to current passing therethrough. Since current does not flow in the elements 116', the change in the resistance of the element 120' results in a change in the overall resistance of the central element 250. When a current is driven across the monitor 60, by probes contacting pads 64 and 68, the voltage may be read across pads 66, 70 connected by conductors 241 across dose and focus sensitive monitor portion 112' in order to determine the resistance of that portion of the monitor. The space-end shortening effect due to variations in exposure will cause changes in the resistance measurement which can then be utilized to determine the dependence of the space length on lithographic and processing conditions.

The electrically conductive dose sensitive monitor portion 114' is made from a lithographic mask similar to dose sensitive mask portion 14 shown in FIG. 3. As shown in detail in FIG. 7, the mask central element 138 has a plurality of outer elements 140a, 140b, 142a, 142b, 144a, 144b arranged in decreasing pitch from the central element. The pitch of the outer elements is again chosen so that, after lithographic exposure and developing, and subsequent etching and deposition of the electrically conductive material, the outer elements are not resolvable. Referring back to FIG. 6, the width A' of electrically conductive monitor portion 114' is sensitive only to dose of the energy beam in a manner analogous to target portion 14' in FIG. 4. Thus, the resistivity of dose sensitive monitor portion 114' will be changed by the width of A', which is in turn affected by the energy beam dose. The resistivity may be determined by driving a current between pads 64 and 68, and measuring the voltage between pads 62 and 66. By comparing the resistances of monitor portions 112' and 114', the individual effects of dose and exposure of the lithographic processing may be determined.

Figure 7:
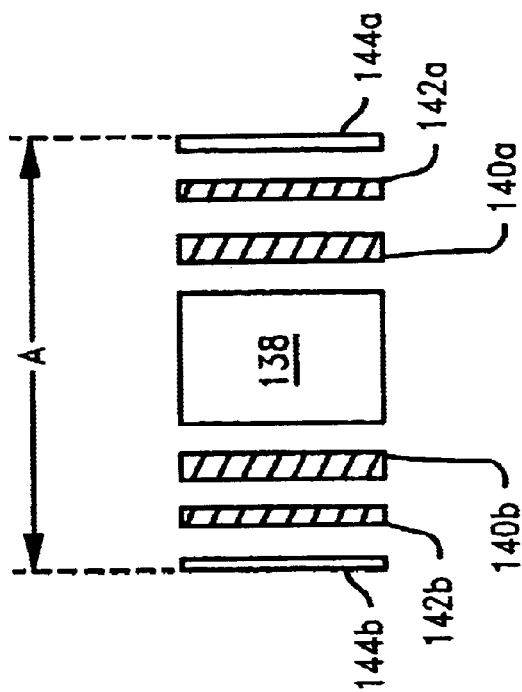
FIG. 7 is a top plan view of a portion of the mask used to make the dose sensitive portion of the monitor of FIG. 5.

A further modification may be made to both the dose sensitive portions of the targets depicted in FIGS. 3 and 7. The edges that form the measurable dimension A' can be defined in a variety of ways using subresolution patterns that gradually change the mask transmission in the vicinity of the edge. As shown in FIG. 8(a), instead of having outer elements being parallel to the central element 38 or 138, spaced, parallel elements 150 perpendicular to the central element may be used. Each parallel element 150 has a length (horizontal) and a width (vertical). The ends of the elements 150 farthest from the central element are aligned to form parallel opposing array edges, so that the array width is again A. These perpendicular elements 150 have a width and spacing selected so that the pitch $P_2$ (the sum of the element width and spacing) is again sufficiently small so that the individual elements 150 are not resolvable after lithographic exposure and developing. Furthermore, the individual elements 150' can be tapered, for example, in steps as shown in FIG. 8(b). Using perpendicular elements 150 for the dose sensitive portions of the masks in FIGS. 3 and 7 would result in the same dose sensitive target portions in FIGS. 4 and 5, respectively.

Figure 8:
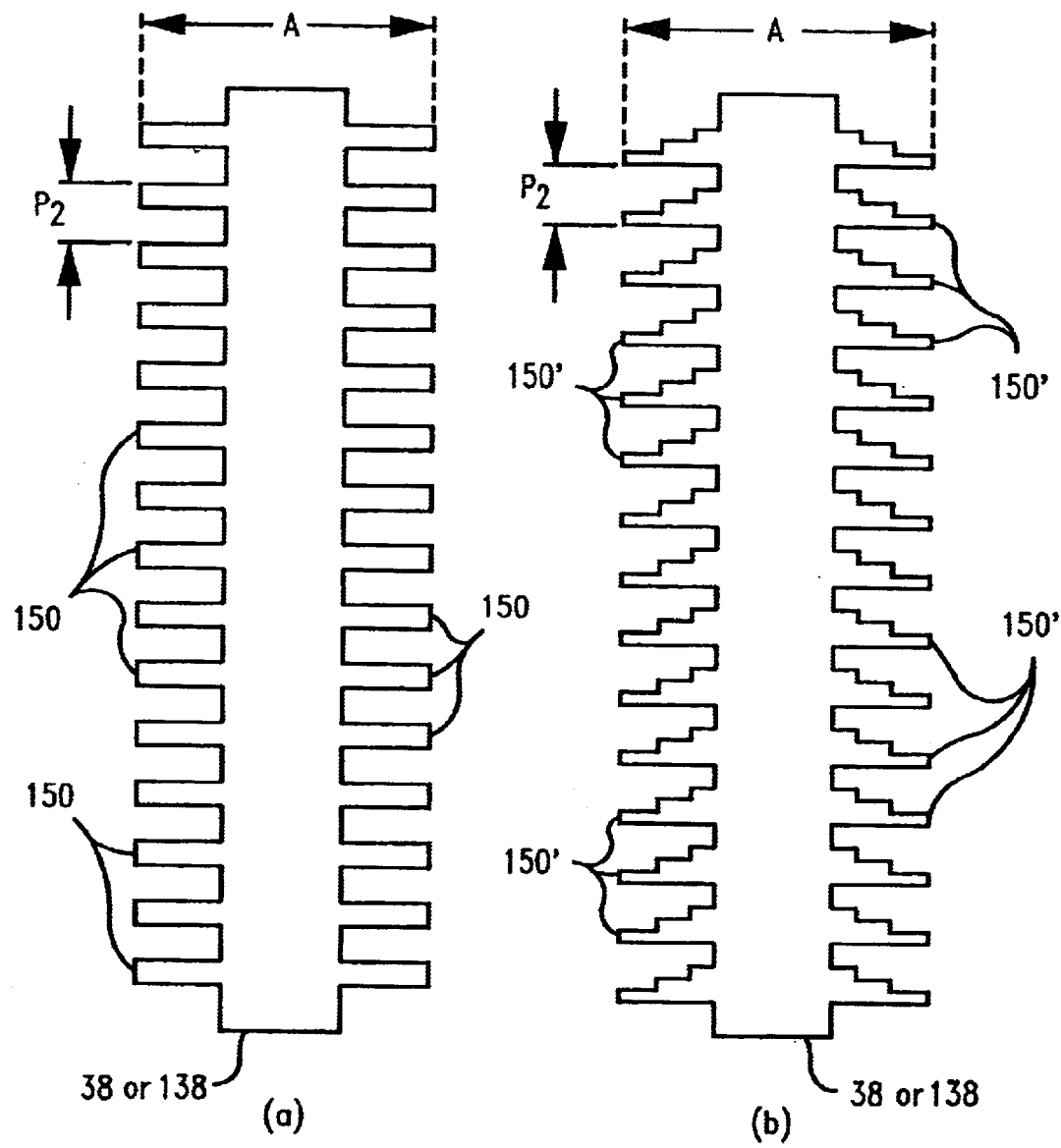
FIG. 8 is a top plan view of alternate embodiments (a) and (b) of the dose sensitive portion of the mask of FIGS. 3 and 7.

FIGS. 3, 7 and 8 represent the most easily fabricated approaches to "feathering" the edges of the dose sensitive target. In general, the edges that form the measurable dimension A' can be defined on the mask by any array of discrete subresolution elements whose density decreases with distance from the edge. For the most part, the choice of the subresolution array layout is determined by mask fabrication capability.

To establish a reasonable operating regime for the electrically testable monitors corresponding to current lithography capability, it is useful to consider an example:

Resistivity: $\rho_1 = 250\ \Omega/\mu m$ (doped poly-silicon),
Linewidth/spacewidth, 116' in FIG. 5: $0.15\ \mu m$
Nominal dimensions: A', B'=$0.3\ \mu m$
Length of 114' and 120' in FIG. 5: $9\ \mu m$ Under the above conditions we can estimate the resistance R across the electrical monitors:

$$R_{A'} = 2R_{B'} = 9 \times 250/(0.3) = 750\ \Omega$$

These values of resistance fall in a range that can be measured easily with better than 0.1% precision using conventional electrical probe techniques.

In operation, any of the electrically testable monitors made in accordance with the present invention may be fabricated on test wafers for the characterization of lithography processes or included in a particular semiconductor product layer comprised of appropriate conductive materials and whose exposure and/or dose parameters are to be measured. By quickly and easily driving a fixed current across the monitor and reading and recording the voltage utilizing well known devices, the resistance of the monitor may be determined. Such resistance may be prepared to a measurement taken under varying lithographic and/or etch conditions in order to determine whether the actual process conditions comply with the manufacturing requirements.

Accordingly, the present invention provides an electrically testable structure to solve relative dose, focus and etch problems which is easy and inexpensive to utilize and which utilizes little space on a wafer substrate. The electrically testable monitor of the present invention is particularly useful for automated systems and does not require visual monitoring.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A metrology target mask for determining proper lithographic exposure dose and focus in a pattern formed in a layer on a semiconductor substrate by lithographic processing comprising:
   a mask substrate;
   a first, dose and focus sensitive mask portion on the mask substrate having a first array of elements comprising a plurality of spaced, substantially parallel elements having essentially the same length and width, ends of the individual elements being aligned to form first and second opposing array edges, the pitch of said first array of elements being selected such that, when lithographically printed in a layer on a semiconductor substrate, first array of elements are resolvable, with the lengths of and spaces between said elements being sensitive to both dose and focus of an energy beam; and
   a second, dose sensitive mask portion on the mask substrate having a second array of elements comprising a central element having a length and a width, and a plurality of spaced, substantially parallel outer elements, each having a length and a width, the widths of the outer elements being less than the width of the central element, edges of the outer elements on each side of and farthest from the central element forming opposing array edges, the pitch of said outer elements being selected such that, when lithographically printed in a layer on a semiconductor substrate the outer elements are not resolvable and width of the second portion is sensitive to dose but not focus of the energy beam, wherein, after projecting an energy beam through the mask and lithographically printing the mask portions in a layer on a semiconductor substrate and determining the widths of the first and second target portions in the layer by measuring distance between opposing array edges in each of the first and second portions, dose and focus of the energy beam during lithographic processing of said layer can be determined.

2. The mask of claim 1 wherein the edges of the array in the first mask portion are substantially parallel to edges of the array in the second mask portion, and the elements in the first mask portion are substantially perpendicular to the elements in the second mask portion.

3. The mask of claim 1 wherein pitch between elements of the arrays in the second mask portion is less than the resolution limit of the energy beam used to expose the mask in the lithographic processing.

4. The mask of claim 1 wherein the second, dose sensitive mask portion includes a plurality of outer elements on each side of said central element, the widths of the outer elements decreasing with distance from the central element.

5. The mask of claim 1 wherein the elements of the first and second mask portions comprises opaque elements on a substantially transparent mask substrate.

6. The mask of claim 1 wherein the elements of the first and second mask portions comprises substantially transparent elements on an opaque mask substrate.

7. A method of determining proper lithographic exposure dose and focus in a pattern formed in a layer on a semiconductor substrate by lithographic processing, the method comprising:

providing a semiconductor substrate;

providing the metrology target mask of claim 1;

projecting an energy beam through the mask onto the semiconductor substrate;

lithographically forming a target in a layer on the semiconductor substrate having first and second target portions corresponding to the first and second mask portions, respectively;

determining the widths of the first and second target portions in the layer by measuring distance between opposing array edges in each of the first and second portions; and using the measured widths of the first and second target portions in the layer to determine dose and focus of the energy beam used during lithographic processing of said layer.

8. The method of claim 7 wherein the elements of the second, dose sensitive mask portion are not resolved by the energy beam in forming the corresponding second target portion, and wherein the second target portion comprises a single element formed in the layer on the semiconductor substrate having a length and a width, with edges along the length of the single element forming opposing array edges.

9. The method of claim 8 wherein the edges of the array in the first target portion are substantially parallel to edges of the array in the second target portion, and the elements in the first target portion are substantially perpendicular to the element in the second target portion.

10. A metrology target mask for determining proper lithographic exposure dose and focus in a pattern formed in a layer on a semiconductor substrate by lithographic processing comprising:

a mask substrate;

a first, dose and focus sensitive mask portion on the mask substrate having a first array of elements comprising a plurality of spaced, substantially parallel elements having essentially the same length and width, ends of the individual elements being aligned to form first and second opposing array edges, the pitch of said first array of elements being selected such that, when lithographically printed in a layer on a semiconductor substrate, first array of elements are resolvable, with the lengths of and spaces between said elements being sensitive to both dose and focus of an energy beam; and a second, dose sensitive mask portion on the mask substrate having a second array of elements comprising a central element having a length and a width, and a plurality of spaced, substantially parallel outer elements having a length and a width, the outer elements being substantially perpendicular to the central element, ends of the outer elements farthest from the central element being aligned to form first and second opposing array edges, the pitch of said outer elements being selected such that, when lithographically printed in a layer on a semiconductor substrate, the outer elements are not resolvable and width of the second portion is sensitive to dose but not focus of the energy beam, wherein, after projecting an energy beam through the mask and lithographically printing the mask portions in a layer on a semiconductor substrate and determining the widths of the first and second target portions in the layer by measuring distance between opposing array edges in each of the first and second portions, dose and focus of the energy beam during lithographic processing of said layer can be determined.

11. The mask of claim 10 wherein the edges of the array in the first mask portion are substantially parallel to edges of the array in the second mask portion, and the elements in the first mask portion are substantially perpendicular to the outer elements in the second mask portion.

12. The mask of claim 11 wherein the outer elements on the second, dose sensitive mask portion are tapered.

13. The mask of claim 10 wherein pitch between outer elements of the arrays in the second dose sensitive mask portion is less than the resolution limit of the energy beam used to expose the mask in the lithographic processing.

14. A method of determining proper lithographic exposure dose and focus in a pattern formed in a layer on a semiconductor substrate by lithographic processing, the method comprising:

providing a semiconductor substrate;

providing the metrology target mask of claim 10;

projecting an energy beam through the mask onto the semiconductor substrate;

lithographically forming a target in a layer on the semiconductor substrate having first and second target portions corresponding to the first and second mask portions, respectively;

determining the widths of the first and second target portions in the layer by measuring distance between opposing array edges in each of the first and second portions; and using the measured widths of the first and second target portions in the layer to determine dose and focus of the energy beam used during lithographic processing of said layer.

15. The method of claim 14 wherein the elements of the second, dose sensitive mask portion are not resolved by the energy beam in forming the corresponding second target portion, and wherein the second target portion comprises a single element formed in the layer on the semiconductor substrate having a length and a width, with edges along the length of the single element forming opposing array edges.

16. A metrology target for determining proper lithographic exposure dose and focus in a pattern formed in a layer on a semiconductor substrate by lithographic processing comprising:

a substrate;

a first, dose and focus sensitive target portion in a lithographically formed layer on the substrate having a first array of elements comprising a plurality of spaced, substantially parallel elements having essentially the same length and width, ends of the individual elements being aligned to form first and second opposing array edges, the pitch of said first array of elements being selected such that, when lithographically printed in a layer on a semiconductor substrate, first array of elements are resolvable, with the lengths of and spaces between said elements being sensitive to both dose and focus of an energy beam; and a second, dose sensitive target portion in the lithographically formed layer on the substrate having a single element having a length and a width, edges along the length of the single element forming opposing array edges, the width of the single element being sensitive to dose but not focus of the energy beam when lithographically printed in a layer on a semiconductor substrate, wherein, after determining the widths of the first and second target portions in the layer by measuring distance between opposing array edges in each of the first and second portions, dose and focus of the energy beam used during lithographic processing of said layer can be determined.

17. The target of claim 16 wherein the edges of the array in the first target portion are substantially parallel to edges of the single element array in the second target portion, and the elements in the first target portion are substantially perpendicular to the elements in the second target portion.

18. The target of claim 16 wherein the substrate is electrically non-conductive, the elements in each of the first and second target portions are electrically conductive, and the elements in the first array are electrically connected, and wherein, upon applying a current across each of the arrays and measuring the voltage, the suitability of the layer can be determined by the resistance of each of the arrays.

19. The target of claim 18 wherein each target portion has a first end and a second end, the target portions being electrically connected at the second ends, and including electrically conductive pads at the first end of each of the target portions and the connected second ends of the target portions such that current may be applied between the pads on the target portion first ends and voltage may be measured between the first and second ends of each of the targets.

20. The target of claim 19 wherein the elements in the first target portion are electrically connected by an electrically conductive central element, and wherein the individual elements of the first target portion extend in a perpendicular direction from each side of the first target portion central element.

21. A method of electrically testing image shortening of a pattern formed on a substrate by lithographic or etch processing comprising:

providing the target of claim 18;

applying a current across the first and second target portions;

measuring the voltage drop and determining the resistance across each of the first and second target portions; and determining the suitability of the layer by the resistance of the first and second target portions.

22. The method of claim 21 wherein there is determined the suitability of energy beam dose or focus on a lithographically formed layer.

* * * * *